Sept. 29, 1964 R. DAHLBERG 3,151,007

METHOD OF FABRICATING LAMINAR SEMICONDUCTOR DEVICES

Filed Jan. 27, 1961

INVENTOR.
REINHARD DAHLBERG

BY

Francis L. Marsella

ATTORNEY

United States Patent Office 3,151,007

Patented Sept. 29, 1964

3,151,007
METHOD OF FABRICATING LAMINAR SEMICONDUCTOR DEVICES

Reinhard Dahlberg, Freiburg im Breisgau, Germany, assignor to Clevite Corporation, a corporation of Ohio Filed Jan. 27, 1961, Ser. No. 85,225
Claims priority, application Germany, Feb. 9, 1960, J 17,666
13 Claims. (Cl. 148—177)

This invention relates to methods for the production of junction-type semiconductor devices and particularly high frequency transistors, comprising thin laminations and surface junctions.

In commercial production, laminar semiconductor devices are sometimes fabricated by bonding a plate of semiconductor material of a particular conductivity type to a supporting metal plate of molybdenum or tantalum, for example. Bonding is effected with a suitable alloying material interposed between the semiconductor and the metal plate and selected to form a rectifying junction at the interface or, if desired, to produce ohmic contact therebetween. One or more additional layers forming P–N junctions may then be applied to the semiconductor material.

This method of fabrication is used primarily in the production of high frequency transistors inasmuch as it makes possible the mechanical or chemical erosion of the semiconductor plate to the extremely small thickness dimensions required without regard for its mechanical strength.

Owing to the small dimensions of such transistors it is not feasible in commercial production to prepare individual semiconductor assemblies in this manner. Consequently it is customary to employ sheets of metal and semiconductor which are large in comparison to the size of the individual devices, bond them together, and then sub-divide the resulting sandwich to obtain individual semiconductor structures.

This expedient has a very serious shortcoming: the different coefficients of thermal expansion of the materials of the respective plates, coupled with the fact that they are firmly bonded together over relatively large areas, gives rise to stresses which in turn produce cracks in the semiconductor plate. Many of the resulting individual structures are, therefore, rendered useless.

Attempts have been made to solve this problem by designing alloys for the supporting plates which have thermal expansion coefficients substantially equal to those of the semiconductor material. This approach to the problem, however, has not proved successful because irregularities in the material still create stresses. Furthermore, the different coefficient of expansion of the alloyed regions with respect to the bulk of the semiconductor plate still causes difficulty.

The fundamental object of the present invention is to provide improved methods for fabricating laminar semiconductor assemblies and devices which avoid or mitigate at least one of the problems of the prior art as outlined above.

A more specific object is the provision of novel methods for fabricating laminar semiconductor devices and assemblies which minimize cracked or similarly defective elements.

Another object is the provision of improved methods for fabricating laminar semiconductor structures and devices in which relatively large numbers of devices are formed and handled as a single unit without involving large continuous areas of surface contact such as give rise to deleterious stresses.

A further object is the provision of semiconductor assemblies and devices which are bonded to a mechanical supporting layer without the problems and difficulties heretofore encountered in the fabrication of structures so supported.

These and additional objects are attained by methods of fabricating semiconductor assemblies and devices in accordance with the present invention which comprise providing a plate of semiconductor material of a particular conductivity type; providing a plurality of depressions on a major surface of the plate subdividing the surface into a plurality of individual co-planar regions; bonding the sub-divided surface of the plate of semiconductor material to a metal supporting plate; and then eroding the surface of the semiconductor plate opposite the sub-divided surface down to the bottoms of the depressions.

In accordance with other features of the invention the structure is subsequently sub-divided into individual elements by cutting through the metal supporting plate along the locus of the grooves; also, junctions may be formed on the surface of the semiconductor plate resulting from the erosion.

Additional objects of the invention, its advantages, scope and the manner in which it may be practiced will be readily apparent to persons conversant with the art from the following description of presently preferred embodiments thereof, taken in conjunction with the subjoined claims and the annexed drawings in which like parts are designated with like characters of reference throughout the several views and:

Figure 1:
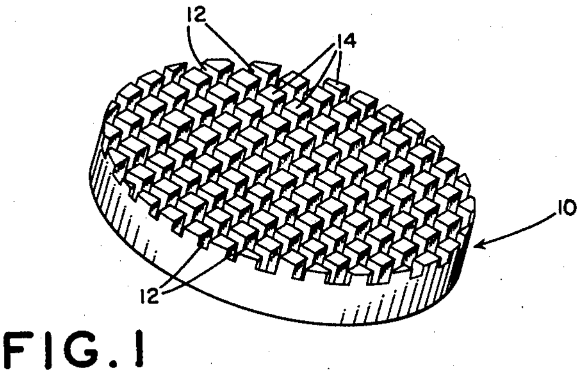
FIGURE 1 is a perspective elevational view of a plate of semiconductor material subsequent to the performance of one of the initial steps of the method contemplated by the invention.

Referring now to the drawings, FIGURE 1 illustrates a plate 10 of semiconductor material and may consist of a slice cut from a single crystal ingot of any desired semiconductor material having either N- or P-type conductivity. For the purposes of example it will be assumed that the material of plate 10 is P-type germanium.

As appears in the drawings one major surface of plate 10 is provided with a plurality of intersecting grooves or depressions 12 of substantial depth forming a grid or network which sub-divides the surface of the plate into a plurality of individual co-planar surface regions 14 of suitable shape and area for the fabrication of semiconductor devices. In the illustrated embodiment there are two sets or groups of mutually parallel depressions intersecting at right angles, with the result that individual surface regions 14 are substantially square. It will be appreciated, however, that the spacing and angles of intersection of the depressions may be selected to produce whatever shapes and areas are required.

The depressions in the surface of plate 10 can be produced in any suitable manner, mechanical or chemical. Thus, for example, gang saws or ultrasonic scribes or cutters may be employed. Another convenient alternative is to produce the depressions by selective etching of the surface, using a suitable mask; in this connection, it will be understood that the depressions, particularly when produced in this manner, can be of a configuration such as would make individual surface regions 14 circular in form. In other words, the depressions need not be rectilinear in extent nor of constant width.

Semiconductor plate 10, so prepared, is then alloyed by means of its grooved surface to a metal supporting or re-inforcing plate 16, e.g., of molybdenum, tantalum, or the like. A suitable alloying material is employed in bonding the semiconductor to the supporting plate, the particular alloying material being selected in accordance with the type of contact desired, i.e., ohmic or rectifying. Thus, for example, in keeping with the assumption that plate 10 is P-type, antimony may be used as the alloying material to produce a rectifying P–N junction in the region of the interface between the semiconductor plate 10 and supporting plate 16. On the other hand, if a non-rectifying or ohmic contact between a P-type semiconductor material and the supporting metal is desired, aluminum could be used as an alloying material.

Figure 2:
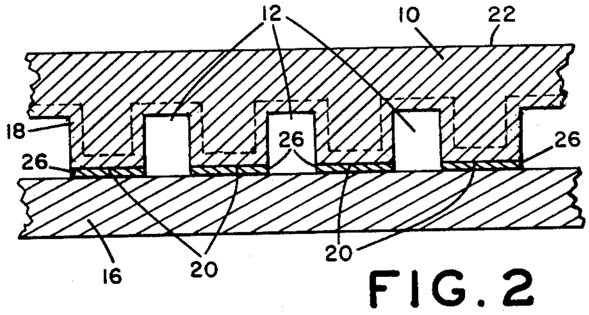
FIGURES 2 and 3 are fragmentary sectional views including, on a larger scale, a portion of the element shown in FIGURE 1 and additional structural components as they appear at subsequent stages of fabrication.

If desired the grooved surface of semiconductor plate 10 can be provided with a doped base layer of opposite conductivity type prior to alloying to the support plate. The assembly shown in FIGURE 2 illustrates a structure in which this has been done, the doped base layer being designated by reference numeral 18. In the assumed example base layer 18 is doped with a suitable donor agent conferring on the layer N-type conductivity. The doping agent could be, for example, antimony and preferably is introduced by diffusion.

In the illustrated embodiment (FIGURE 2), the presence of N-type layer 18 and the use of aluminum to alloy the semiconductor plate 10 to a supporting plate 16 results in the formation of a P–N junction 20 in the vicinity of the interface and, since the semiconductor plate 10 has P-type conductivity, a P–N–P structure is obtained. It is possible, of course, by suitable choice of the alloying material to obtain an ohmic contact between semiconductor plate 10 and metal supporting plate 16 notwithstanding the presence of N-type layer 18.

After semiconductor plate 10 has been bonded to metal support plate 16 as described above, with or without prior formation of base layer 18, the exposed major surface 22 of the semiconductor plate, i.e., the surface opposite that bonded to plate 16, is eroded down to the bottoms of depressions 12. In other words the thickness of seimconductor plate 10 is reduced by an amount exceeding its original thickness less the depth of the depressions. This reduction can be accomplished mechanically as, for example, by grinding or lapping, or by chemical treatment such as etching.

Figure 3:
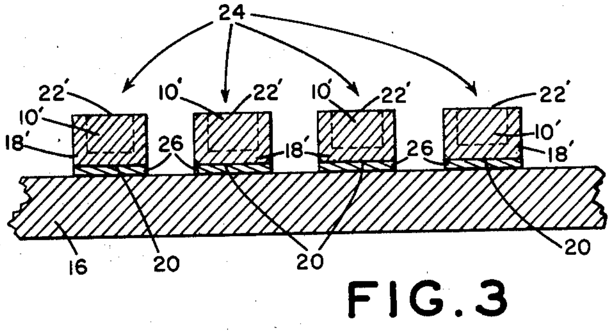

Referring to FIGURE 3, at this stage the resulting assembly, consists of metal plate 16 having bonded thereto a plurality of individual, spaced structures 24 each consisting, in the assumed example, of a segment 10' of P-type germanium; an N-type base layer 18' of germanium diffused with antimony and a P-type layer 26 of antimony-doped germanium alloyed with aluminum. Individual devices can then be completed by cutting metal plate 16 along lines coinciding with the locus of the grooves (12) separating structures 24 and by applying to the individual structures, prior or subsequent to such cutting, electrodes and terminal leads in the usual manner.

Figure 4:
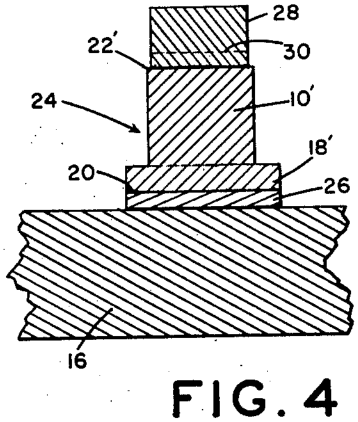
FIGURE 4 is a side elevational view partially in section and on a larger scale than FIGURE 2 illustrating an individual semiconductor assembly at a final stage of fabrication.

If desired additional junctions can be formed on the eroded surface 22' of the individual segments 10' of the semiconductor plate. A single such structure is illustrated in FIGURE 4 on an enlarged scale relative to the showing in FIGURES 2 and 3. The respective layers from support plate 16 to the P-type germanium segment 10' are the same as just described with reference to FIGURE 3. A suitable conductivity-type determining material is applied to the upper surface of the P-type germanium layer 10' and alloyed or diffused to create an additional layer 28 of opposite conductivity-type. In the assumed case antimony, for example, is employed as the doping agent so that layer 28 is of N-type conductivity forming a P–N junction 30 with the underlying layer 10' of P-type germanium. The result is a P–N–P–N structure of the type used in four layer semiconductor switching devices.

From the foregoing description it will be noted that at no stage of the fabrication process does a continuous large area bond exist between the metal support sheet and the contiguous semiconductor material. The bonded areas are limited to the various small surfaces actually required in the finished elements; in this way the formation of cracks between respective layers due to differences to thermal expansion coefficients and other causes is largely eliminated.

While there have been described what at present are considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of the invention.

What is claimed and desired to be secured by United States Letters Patent is:

1. A method of fabricating laminar semiconductor structures, comprising: providing a plate of semiconductor material; forming depressions on a major surface of said plate sub-dividing said surface into a plurality of individual co-planar regions delimited and mutually segregated by said depressions; alloying said surface of the semiconductor plate to a metal reinforcing plate; and eroding the other major surface of the semiconductor plate down to said depressions.

2. A method according to claim 1 wherein the semiconductor plate is alloyed to the reinforcing plate by use of a conductivity-type determining alloying material forming a rectifying junction with said semiconductor plate.

3. A method according to claim 1 wherein the semiconductor plate is alloyed to the reinforcing plate by means of an alloying material producing a substantially ohmic contact therebetween.

4. A method of the fabricating laminar semiconductor structures, comprising: providing a plate of semiconductor material of a particular conductivity type; forming depressions on a major surface of said plate subdividing said surface into a plurality of individual coplanar regions of similar shape and area delimited and mutually segregated by said depressions; forming on said plate adjacent said major surface a layer having a conductivity-type opposite to that of the plate; alloying said surface of the semiconductor plate to a metal reinforcing plate; and eroding the other major surface of the semiconductor plate down to said depressions.

5. A method according to claim 4 wherein said one major surface of the semiconductor plate is alloyed to said metal plate by use of a conductivity-type determining material producing a region of conductivity opposite to that of said layer and forming a rectifying junction therewith.

6. A method according to claim 4 wherein said one major surface of said semiconductor plate is alloyed to said metal plate by use of an alloying material producing an ohmic contact therebetween.

7. A method of fabricating laminar semiconductor devices comprising: providing a plate of semiconductor material of a particular conductivity-type; forming a plurality of intersecting grooves of substantial depth with respect to the thickness of said plate in one major surface thereof, said grooves forming a grid-like arrangement sub-dividing said surface into individual co-planar regions of similar shape and area; diffusing into the grooved surface of the plate a conductivity-type determining agent adapted to create thereon a layer having a conductivity-type opposite to that of the remainder of the plate and forming therewith a rectifying junction; alloying the grooved surface of said semiconductor plate to a metal sheet; and eroding the surface of said semiconductor plate opposite the grooved surface to eliminate the ungrooved thickness portion of said plate.

8. The method according to claim 7 wherein the eroding is accomplished by chemical etching.

9. The method according to claim 7 wherein the eroding is accomplished by grinding.

10. A method according to claim 7 including the further step of applying on the free surface of said semiconductor plate resulting from the erosion thereof a conductivity-type determinant forming a rectifying P–N junction.

11. A method according to claim 7 including the further step of cutting through said metal plate along lines corresponding to said grooves so as to separate said regions and the associated segments of the metal plate into discrete structures.

12. A method of fabricating laminar semiconductor devices comprising: providing a single crystal plate of P-type semiconductor material; etching into one surface of the plate intersecting groups of parallel grooves of substantial depth with respect to the thickness of said plate, said grooves forming a grid-like arrangement sub-dividing said surface into individual regions of similar shape and area; diffusing a donor material into the grooved surface of said plate to create thereon an N-type base layer; alloying the grooved surface of said semiconductor plate with aluminum to a plate of a metal selected from the group consisting of molybdenum and tantalum; and eroding the surface of the semiconductor plate opposite said grooved surface to eliminate the ungrooved thickness portion of said plate.

13. A method according to claim 10 including the further step of doping the eroded surface of the semiconductor plate with a donor material to form an N-type layer thereon.

References Cited in the file of this patent

UNITED STATES PATENTS

| | | |
|---|---|---|
| 2,582,685 | Eisler | Jan. 15, 1952 |
| 2,692,190 | Pritikin | Oct. 19, 1954 |
| 2,758,263 | Robillard | Aug. 7, 1956 |
| 2,930,950 | Teszner | Mar. 29, 1960 |